US008354296B2

(12) United States Patent
Dimitrakopoulos et al.

(10) Patent No.: US 8,354,296 B2
(45) Date of Patent: Jan. 15, 2013

(54) SEMICONDUCTOR STRUCTURE AND CIRCUIT INCLUDING ORDERED ARRANGEMENT OF GRAPHENE NANORIBBONS, AND METHODS OF FORMING SAME

(75) Inventors: Christos D. Dimitrakopoulos, Baldwin Place, NY (US); Alfred Grill, White Plains, NY (US); Timothy J. McArdle, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 46 days.

(21) Appl. No.: 13/009,048

(22) Filed: Jan. 19, 2011

(65) Prior Publication Data

US 2012/0181507 A1      Jul. 19, 2012

(51) Int. Cl.
*H01L 51/40* (2006.01)
(52) U.S. Cl. ....... 438/99; 438/82; 257/40; 257/E21.254; 977/755; 977/762
(58) Field of Classification Search ............. 257/40; 438/82, 99; 977/755, 762
See application file for complete search history.

(56) References Cited

U.S. PATENT DOCUMENTS

| 6,536,106 | B1 | 3/2003 | Jackson et al. |
| 2006/0110847 | A1* | 5/2006 | Fujimori et al. ............... 438/99 |
| 2009/0239042 | A1* | 9/2009 | Jain et al. .................. 428/195.1 |
| 2010/0112731 | A1* | 5/2010 | Ikeda ............................ 438/14 |

OTHER PUBLICATIONS

Morrow, Thomas J. et al., "Programmed Assembly of DNA-Coated Nanowire Devices", Science Magazine, Jan. 16, 2009, p. 352, vol. 323.
Smith, Peter A. et al., "Electric-field assisted assembly and alignment of metallic nanowires", Applied Physics Letters, Aug. 28, 2000, pp. 1399-1401, vol. 77, No. 9.

* cited by examiner

*Primary Examiner* — Wai Sing Louie
(74) *Attorney, Agent, or Firm* — Scully, Scott, Murphy & Presser, P.C.; Louis J. Percello, Esq.

(57) ABSTRACT

A semiconductor structure including an ordered array of parallel graphene nanoribbons located on a surface of a semiconductor substrate is provided using a deterministically assembled parallel set of nanowires as an etch mask. The deterministically assembled parallel set of nanowires is formed across a gap present in a patterned graphene layer utilizing an electric field assisted assembly process. A semiconductor device, such as a field effect transistor, can be formed on the ordered array of parallel graphene nanoribbons.

10 Claims, 5 Drawing Sheets

SEMICONDUCTOR STRUCTURE AND CIRCUIT INCLUDING ORDERED ARRANGEMENT OF GRAPHENE NANORIBBONS, AND METHODS OF FORMING SAME

BACKGROUND

The present application relates to a semiconductor structure and a method of forming the same. More particularly, the present application relates to a semiconductor structure including an ordered array of parallel graphene nanoribbons, a method of forming such a structure, and a semiconductor circuit including at least one semiconductor device that can be formed on the ordered array of parallel graphene nanoribbons.

Several trends presently exist in the semiconductor and electronics industry including, for example, devices are being fabricated that are smaller, faster and require less power than the previous generations of devices. One reason for these trends is that personal devices such as, for example, cellular phones and personal computing devices, are being fabricated that are smaller and more portable. In addition to being smaller and more portable, personal devices also require increased memory, more computational power and speed. In view of these ongoing trends, there is an increased demand in the industry for smaller and faster transistors used to provide the core functionality of the integrated circuits used in these devices.

Accordingly, in the semiconductor industry there is a continuing trend toward fabricating integrated circuits (ICs) with higher densities. To achieve higher densities, there has been, and continues to be, efforts toward down scaling the dimensions of the devices on semiconductor wafers generally produced from bulk silicon. In order to accomplish these trends, high densities, smaller feature sizes, smaller separations between features, and more precise feature shapes are required in integrated circuits (ICs). These trends are pushing the current technology to its limits.

In view of the above, the semiconductor industry is pursuing graphene to achieve some of the aforementioned goals. Graphene, which is essentially a flat sheet of carbon atoms, is a promising material for radio frequency (RF) transistors and other electronic devices. Typical RF transistors are made from silicon or more expensive semiconductors such as, for example, indium phosphide (InP).

With all its excellent electronic properties, graphene is missing a bandgap, making it unsuitable for fabrication of digital devices. Transistors fabricated using graphene in the channel would have $I_{on}/I_{off}$ ratios of the order of 10 or less, with many more orders of magnitude still required for proper function of such devices. It has been shown that bandgaps can be created in graphene if fabricated in the form of nanoribbons. The size of the bandgap increases with decreasing width of the nanoribbon and for potential practical digital applications the width of the graphene nanoribbons (GNR) has to be less than 10 nm, preferably less than 5 nm.

SUMMARY

A semiconductor structure including an ordered array of parallel graphene nanoribbons located on a surface of a semiconductor substrate is provided using a deterministically assembled parallel set of nanowires as an etch mask. The deterministically assembled parallel set of nanowires is formed across a gap present in a patterned graphene layer utilizing an electrical field assisted assembly process. A semiconductor device, such as a field effect transistor, can be formed on the ordered array of parallel graphene nanoribbons. In such instances, the graphene nanoribbons serve as a channel region of the device.

In one aspect of the present application, a semiconductor structure including an ordered array of parallel graphene nanoribbons is provided. Specifically, the semiconductor structure of the present application includes a substrate having an upper surface, and an ordered array of parallel graphene nanoribbons located on the upper surface of the substrate.

In another aspect of the present application, a method of forming a semiconductor structure including an ordered array of parallel graphene nanoribbons is provided. Specifically, the method includes forming a graphene layer on an upper surface of a substrate. The graphene layer is then patterned into a patterned graphene layer having at least one gap that exposes at least a portion of the upper surface of the substrate. A deterministically assembled parallel set of nanowires is then formed across the at least one gap that is located in the patterned graphene layer. Exposed portions of the graphene layer, not protected by the deterministically assembled parallel set of nanowires, are then etched using the deterministically assembled parallel set of nanowires as an etch mask. The aforementioned processing steps result in a semiconductor structure including ordered arrays of parallel graphene nanoribbons located on the upper surface of the substrate.

In a further aspect of the present application, a semiconductor circuit including an ordered array of parallel graphene nanoribbons is provided. Specifically, the semiconductor circuit includes a substrate, an ordered array of parallel graphene nanoribbons located on an upper surface of the substrate, and at least one semiconductor device formed on the ordered array of parallel graphene nanoribbons.

DETAILED DESCRIPTION

The present application, which provides a semiconductor structure including an ordered array of parallel graphene nanoribbons, a method of forming such a structure, and a semiconductor device that can be formed on the ordered array of parallel graphene nanoribbons, will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present disclosure. However, it will be appreciated by one of ordinary skill in the art that the various embodiments of the present disclosure may be practiced without these specific details. In other instances, well-known structures or processing steps have not been described in detail in order to avoid obscuring the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
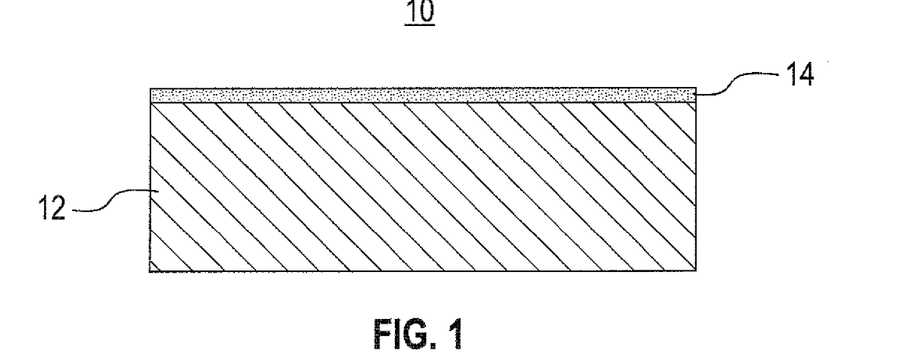
FIG. 1 is a pictorial representation (through a cross sectional view) illustrating an initial structure including a substrate and an overlying graphene layer that can be used in an embodiment of the present application.

Reference is first made to FIGS. 1-8 which illustrate the basic processing steps that can be employed in one embodiment of the present application. Specifically, FIG. 1 illustrates an initial structure 10 that can be employed in one embodiment of the present application. The initial structure 10 includes, from bottom to top, a substrate 12 and a graphene layer 14 located on an upper surface of the substrate 12.

The substrate 12 of the initial structure 10 can be a semiconductor material, a dielectric material, or any combination thereof including a multilayered stack. The term 'semiconductor material' denotes any material that has semiconductor properties. Examples of semiconductor materials that can be employed as substrate 12 include, but are not limited to, Si, SiGe, SiGeC, SiC, Ge alloys, GaAs, InAs, InP, and other III/V or II/VI compound semiconductors. In addition to these listed types of semiconductor materials, the semiconductor material that can be employed as substrate 12 can also be a layered semiconductor such as, for example, Si/SiGe, Si/SiC, sapphire/SiC, silicon-on-insulators (SOIs) or silicon germanium-on-insulators (SGOIs), and other III/V or II/VI compound semiconductors. In some embodiments, the substrate 12 can be a Si-containing semiconductor material, i.e., a semiconductor material that includes silicon.

In one embodiment of the present application, the substrate 12 is composed of SiC whose top surface can be converted into the graphene layer 14. When SiC is employed as the substrate 12, the SiC substrate is at least of semi-insulating quality. By "semi-insulating quality" it is meant that the substrate has a resistivity of at least $1 \times 10^9$ ohm·cm.

The semiconductor material that can be employed as substrate 12 can be single crystalline, polycrystalline, or amorphous. The semiconductor materials that can be employed as substrate 12 can be undoped, doped or contain doped and undoped regions therein. In one embodiment, the semiconductor material is a top layer of a multilayer stack that is employed as substrate 12.

The dielectric material that can be employed as substrate 12 includes any material having insulator properties. Examples of dielectric materials that can be employed as substrate 12 include, but are not limited to, glass, $SiO_2$, SiN, organosilicate glass (OSG, SiCOH, or porous SiCOH), SiC:H, SiCN:H, plastic, diamond-like carbon, boron nitride (BN), carbon boron nitride ($C_xBN$) or a mixture of amorphous/hexagonal bonding boron nitride and carbon boron nitride. In one embodiment, the dielectric material is a top layer of a multilayer stack that is employed as substrate 12.

As is illustrated in FIG. 1, graphene layer 14 is located on an upper surface of substrate 12. The term "graphene" is used herein to denote a one-atom-thick planar sheet of $sp^2$-bonded carbon atoms that are densely packed in a honeycomb crystal lattice. The graphene employed as graphene layer 14 has a two-dimensional (2D) hexagonal crystallographic bonding structure. The graphene that can be employed as graphene layer 14 can be comprised of single-layer graphene (nominally 0.34 nm thick), few-layer graphene (2-10 graphene layers), multi-layer graphene (>10 graphene layers), a mixture of single-layer, few-layer, and multi-layer graphene, or any combination of graphene layers mixed with amorphous and/or disordered carbon phases. The graphene employed as graphene layer 14 can also include, if desired, substitutional, interstitial and/or intercalated dopant species as well.

The graphene layer 14 can be formed utilizing techniques that are well known in the art. For example, the graphene layer 14 can be first provided to a handle substrate (not shown) and then transferred to the substrate 12 utilizing a layer transfer technique. The handle substrate can be a semiconductor material, a dielectric material or a metallic material. In one embodiment, and if the graphene layer is formed on Cu, Ni or another like metallic handle substrate, the graphene can be transferred either by covering the graphene layer with a polymer or a thermal transfer tape, dissolving the metal, bonding the graphene layer supported by the polymer onto substrate 12 and dissolving the polymer. In another embodiment, and when a layer of graphene is formed on a metallic handle substrate, the graphene layer can be directly bonded to the substrate 12 and then the metallic handle substrate can be dissolved.

The graphene layer 14 that is formed on the handle substrate prior to transferring to substrate 12 can be formed by mechanical exfoliation of graphite, epitaxial growth on silicon carbide, epitaxial growth on metal substrates, hydrazine reduction in which graphene oxide is placed in a suspension of pure hydrazine which reduces the graphene oxide into graphene, and sodium reduction of ethanol, i.e., by the reduction of ethanol by sodium metal, followed by pyrolysis of the ethoxide product and washing to remove sodium salts.

The thickness of the graphene layer 14 can vary depending on, for example, the technique that is employed in forming the same. In one embodiment, the graphene layer 14 typically has a thickness from 0.34 nm to 10 nm, with a thickness from 0.34 nm to 3.4 nm being more typical, and with a thickness from 0.34 nm to 1.1 nm being even more typical. Other thicknesses besides those mentioned above can also be employed.

Figure 2:
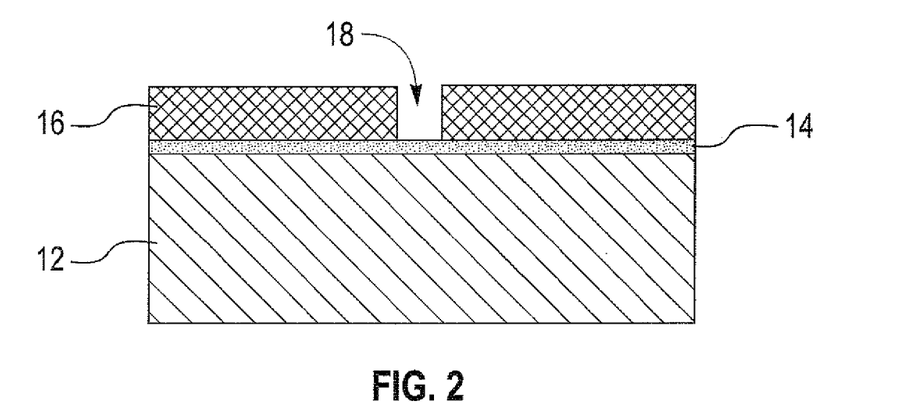
FIG. 2 is a pictorial representation (through a cross sectional view) illustrating the initial structure of FIG. 1 after forming a patterned photoresist having at least one gap on an upper surface of the graphene layer.

Referring now to FIG. 2, there is shown the initial structure 10 of FIG. 1 after forming a patterned photoresist 16 on an upper surface of the graphene layer 14. As shown, the patterned photoresist 16 includes at least one gap, i.e., opening, 18 that exposes at least one underlying surface portion of the graphene layer 14. The at least one gap 18 that is formed within the patterned photoresist 16 has a width that is typically from 30 nm to 30000 nm, with a width from 500 nm to 5000 nm being more typical.

The patterned photoresist 16 having the at least one gap 18 can be formed utilizing a conventional lithographic process including, for example, deposition of a photoresist material, exposing the photoresist material to a desired pattern, i.e., gap pattern, of radiation and developing the exposed photoresist material utilizing a conventional resist developer. The photoresist material that can be employed as the patterned photoresist 16 can include a negative-tone photoresist, a positive-tone photoresist or a hybrid photoresist that includes a combination of positive-tone and negative-tone properties. The photoresist material can be formed atop the graphene layer utilizing any conventional deposition process including, for example, spin-on coating, and spray coating.

In some embodiments of the present application, e-beam lithography can be used in patterning the photoresist material. E-beam lithography, i.e., electron beam lithography, includes scanning a beam of electrons in a patterned fashion across a surface covered with a photoresist material. One advantage of electron beam lithography is that it is one of the ways to beat the optical diffraction limit and make features, i.e., gap 18, in the nanometer regime. By "nanometer regime", it is meant a dimension of less than 100 nm.

Figure 3:
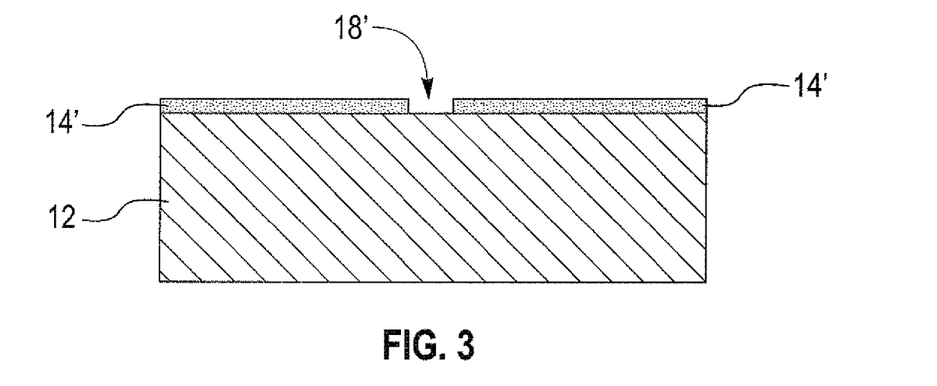
FIG. 3 is a pictorial representation (through a cross sectional view) illustrating the structure of FIG. 2 after transferring the at least one gap into the graphene layer and removing the patterned photoresist.

Referring now to FIG. 3, there is illustrated the structure of FIG. 2 after transferring the at least one gap 18 into the graphene layer 14 and removing the patterned photoresist 16 from the structure. Stated in other terms, FIG. 3 shows the structure of FIG. 2 after patterning the graphene layer 14 into a patterned graphene layer 14' including the at least one gap 18' and removing the patterned photoresist 16 from the structure. The at least one gap 18' in the patterned graphene layer 14' has essentially the same width as that of the at least one gap 18 that was present in the patterned photoresist 16. The patterned graphene layer 14' including the at least one gap 18' can be referred to as a gapped graphene layer. Neighboring portions of patterned graphene layer 14' that are separated by gap 18' will subsequently be employed as electrodes in forming a deterministically assembled parallel set of nanowires atop the patterned graphene layer 14'.

The transferring of the at least one gap 18 into the underlying graphene layer 14 can be achieved utilizing dry etching, wet etching or a combination thereof. When dry etching is employed, one of reactive ion etching, ion beam etching, plasma etching and laser ablation can be used to transfer the at least one gap 18 from the patterned photoresist 16 into the underlying graphene layer 14. When wet etching is employed, a chemical etchant that selectively removes exposed portions of the graphene layer 14 not protected by the patterned photoresist 16 can be employed.

After patterning the graphene layer 14 into patterned graphene layer 14', the patterned photoresist 16 might be removed from atop the structure utilizing a conventional resist stripping process such as, for example, solvent based stripping.

Figure 4:
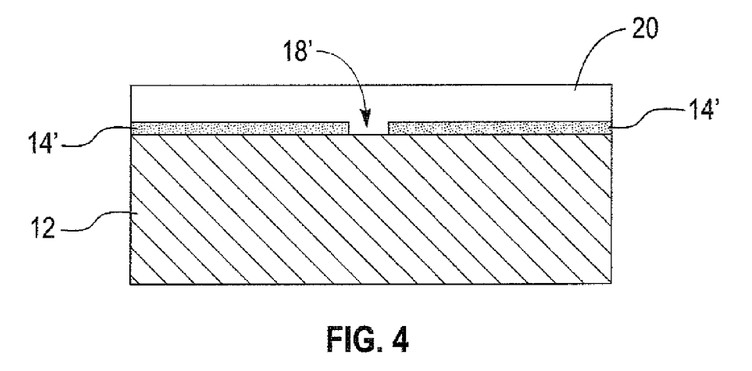
FIG. 4 is a pictorial representation (through a cross sectional view) illustrating the structure of FIG. 3 after forming a dielectric material layer within said at least one gap and atop an upper surface of the patterned graphene layer.

Referring now to FIG. 4, there is shown the structure of FIG. 3 after forming a dielectric material layer 20 within the at least one gap 18' and atop an upper surface of the patterned graphene layer 14'. The dielectric material layer 20 can be comprised of any dielectric material that has etch selectivity to graphene. As such, the dielectric material layer 20 can be used as an etch mask in subsequent processing steps of the present application. Illustrative examples of dielectric materials that can be employed as dielectric material layer 20 include an oxide, a nitride, an oxynitride, a polymer, or any multilayered combination thereof. In one embodiment of the present application, the dielectric material layer 20 is comprised of silicon oxide. In some embodiments of the present application, the dielectric material layer 20 is comprised of a photoresist material.

Notwithstanding the type of dielectric material employed as the dielectric material layer 20, the dielectric material layer 20 typically has a thickness that is from 3 nm to 1000 nm with a thickness from 10 nm to 100 nm being more typical. Other thicknesses that are below and above the aforementioned ranges can also be employed so long as the dielectric material layer 20 maintains it's etch selectivity to graphene.

The dielectric material layer 20 can be formed utilizing conventional techniques well known to those skilled in the art. For example, the dielectric material layer 20 can be formed utilizing a deposition process including, but not limited to, chemical vapor deposition (CVD), plasma enhanced chemical vapor deposition (PECVD), atomic layer deposition (ALD), chemical solution deposition, plating, spin-on deposition, and physical vapor deposition (PVD), such as sputtering and evaporation.

Figure 5:
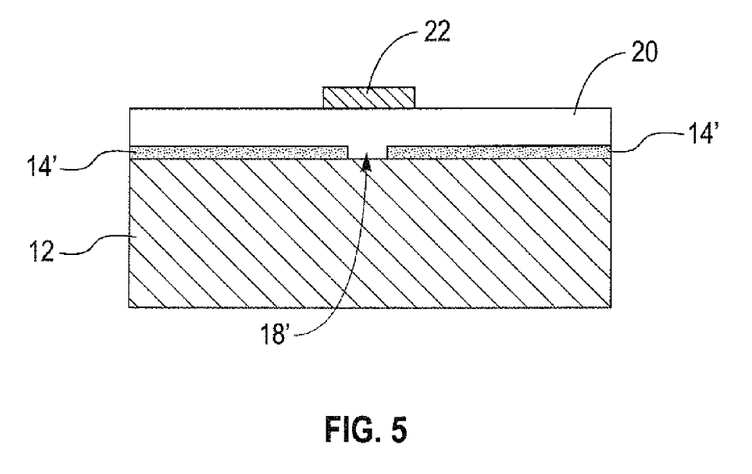
FIG. 5 is a pictorial representation (through a cross sectional view) illustrating the structure of FIG. 4 after forming an ordered array of nanowires on top of the dielectric material layer and across the gap in the patterned graphene layer.
Figure 6:
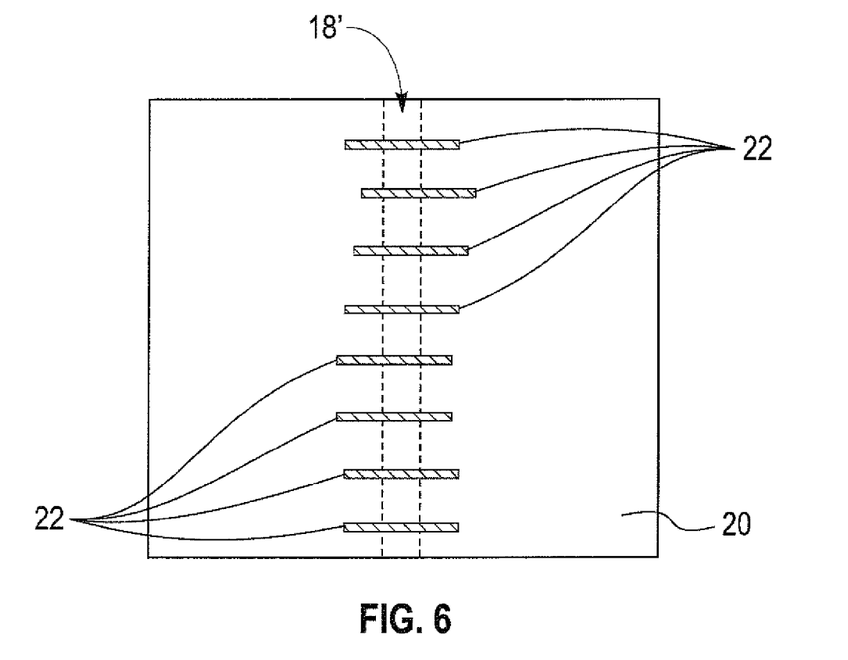
FIG. 6 is a pictorial representation (through a top down view) illustrating the structure whose cross sectional view is shown in FIG. 5.

Referring now to FIGS. 5 (cross sectional view) and 6 (top down view), there are illustrated the structure of FIG. 4 after an ordered array of nanowires 22 is formed on top of the dielectric material layer 20 and across the gap 18' in the patterned graphene layer 14'. As shown, the nanowires are oriented parallel to each other across the gap 18'.

The ordered array of nanowires 22 can be formed utilizing an electric field assisted assembly method. As such, the ordered array of nanowires 22 can also be referred to herein as "a deterministically assembled parallel set of nanowires." The ordered array of nanowires that is formed utilizing the electric field assisted assembly method have a diameter that is typically below 30 nm, with a diameter from 1 to 10 nm being more typical.

The electric field assisted assembly method includes placing the structure shown in FIG. 4 into a bath of a suspension that contains nanowires suspended therein. The suspension employed in the present application may include an organic solvent in which nanowires can be suspended, but not dissolved therein. Examples of solvents that can be used include, but are not limited to de-ionized water or alcohols, such as isopropyl alcohol (IPA). The suspension is typically a dilute suspension. By "dilute suspension" it is meant a solution containing approximately $10^9$ nanowires per mL. The nanowires within the suspension are typically metallic or semiconducting nanowires such as, for example, gold, rhodium, carbon nanotubes or semiconducting silicon.

An AC voltage supplied by any conventional AC power source is then applied to the two electrodes formed by each neighboring gapped graphene layer. The AC voltage that can be used in the present application typical ranges from 5 $V_{rms}$ to 70 $V_{rms}$. The nanowires within the suspension align atop the dielectric material layer 20 and across the gap 18' in the patterned graphene layer 14.

Each nanowire of the ordered array of nanowires 22 typically has a width from 1 nm to 30 nm, with a width from 1 nm to 10 nm being more typical. The height of each nanowire of the ordered array of nanowires 22 is typically from 1 nm to 30 nm, with a height from 1 nm to 10 nm being more typical. Each nanowire within the ordered array of nanowires is spaced apart by a uniform width. By "uniform width" it is meant that the spacing between each parallel oriented nanowire is constant.

Figure 7:
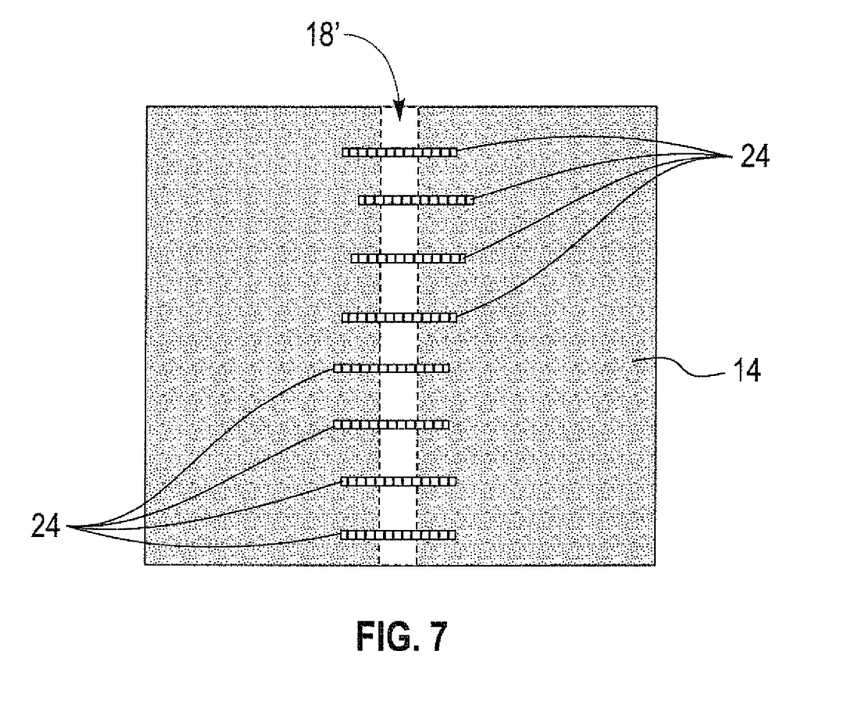
FIG. 7 is a pictorial representation (through a top down view) illustrating the structure of FIG. 6 after etching the dielectric material layer using the ordered array of nanowires as a first etch mask to provide an ordered array of parallel dielectric material nanoribbons.

Referring now to FIG. 7, there is illustrated the structure of FIGS. 5-6 after etching the dielectric material layer 20 using the ordered array of nanowires 22 as a first etch mask to provide an ordered array of parallel dielectric material nanoribbons 24. Portions of the patterned graphene layer 14' not covered by the ordered array of parallel dielectric material nanoribbons 24 may be at least partially removed during this step of the present application.

Each dielectric material nanoribbon of the ordered array of parallel dielectric material nanoribbons 24 has a width that is substantially the same as that of the overlying nanowire. That is, the width of each dielectric material nanoribbon is typically from 1 nm to 30 nm, with a width from 1 nm to 10 nm being more typical. The spacing between each dielectric nanoribbon within the array is also uniform.

The etching that is employed in forming the ordered array of parallel dielectric material nanoribbons 24 selectively removes exposed portions of the dielectric material layer 20 relative to the overlying nanowire. In one embodiment, a wet etching process can be used to form the ordered array of parallel dielectric material nanoribbons 24. In another embodiment, a dry etching process can be used to form the ordered array of parallel dielectric material nanoribbons 24. When a wet etching process is used, a chemical etchant can be used in forming the ordered array of parallel dielectric material nanoribbons 24. When a dry etching process is used, one of reactive ion etching, plasma etching, ion beam etching and laser ablation can be used. In yet another embodiment, a combination of wet etching and dry etching can be used in forming the ordered array of parallel dielectric material nanoribbons 24.

After forming the ordered array of parallel dielectric material nanoribbons 24, the ordered array of nanowires 22 is typically, but not necessarily always, removed from the structure. When the ordered array of nanowires 22 is removed, wet chemical etching can be used in removing the same from the structure. For example, if an array of gold nanowires is used, they may be removed using a potassium-iodine etchant solution.

Figure 8:
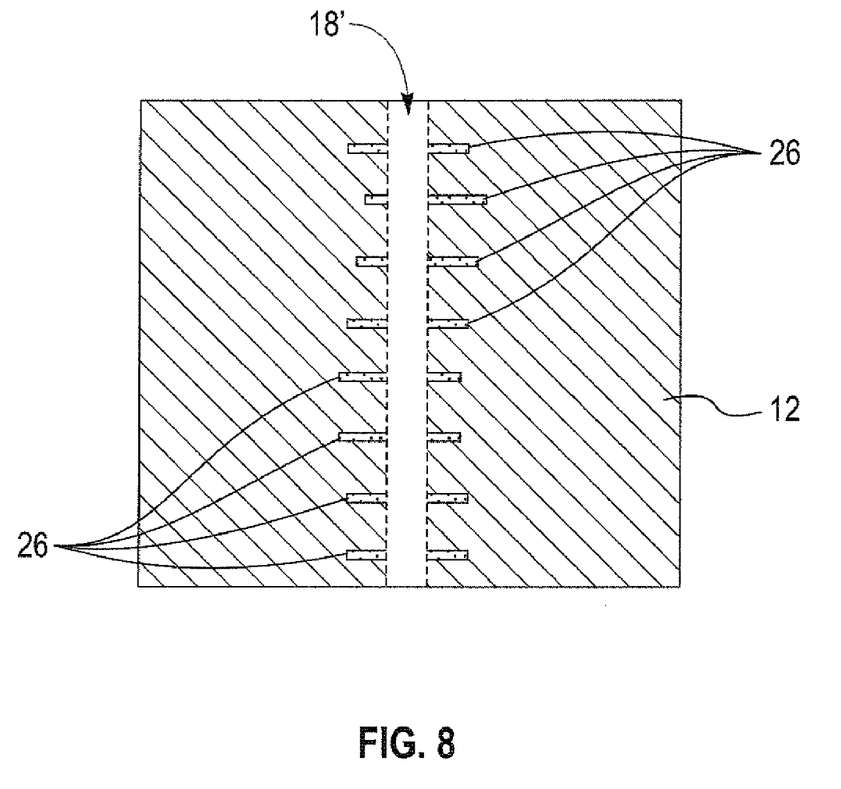
FIG. 8 is a pictorial representation (through a top down view) illustrating the structure of FIG. 7 after etching exposed portions of the patterned graphene layer using the ordered array of parallel dielectric material nanoribbons as a second etch mask to provide an ordered array of parallel graphene nanoribbons on the surface of the substrate.

Referring now to FIG. 8, there is illustrated the structure of FIG. 7 after etching exposed portions of the patterned graphene layer 14' using the ordered array of parallel dielectric material nanoribbons 24 as a second etch mask and removing the dielectric material nanoribbons 24 to provide an ordered array of parallel graphene nanoribbons 26 on the surface of the substrate 12. Each graphene nanoribbon of the ordered array of graphene nanoribbons 26 has a width that is substantially the same as that of the overlying dielectric material nanoribbon. That is, the width of each graphene nanoribbon is typically from 1 nm to 30 nm, with a width from 1 nm to 10 nm being more typical.

Since each nanowire within the ordered array of nanowires is spaced apart by a uniform width, each corresponding graphene nanowire is spaced apart by a uniform width. The term "uniform width" denotes that the spacing between each parallel oriented graphene nanoribbon is constant.

The etching that is employed in forming the ordered array of parallel graphene nanoribbons 26 selectively removes exposed portions of the graphene layer 14 relative to the overlying dielectric material nanoribbon. In one embodiment, a wet etching process can be used to form the ordered array of parallel graphene nanoribbons 26. In another embodiment, a dry etching process can be used to form the ordered array of parallel graphene nanoribbons 26. When a wet etching process is used, a chemical etchant such as, for example, isotropic silicon etchant ($126HNO_3:60H_2O:5NH_4F$) can be used in forming the ordered array of parallel graphene nanoribbons 26. When a dry etching process is used, one of reactive ion etching, plasma etching, ion beam etching and laser ablation can be used. In yet another embodiment, a combination of wet etching and dry etching can be used in forming the ordered array of parallel graphene nanoribbons 26.

After forming the ordered array of parallel graphene nanoribbons 26, each overlying dielectric material nanoribbon is typically, but not necessarily always, removed from the structure. The technique used in removing the dielectric material nanoribbons may vary depending on the type of dielectric material employed. In one embodiment, and when the dielectric material is comprised of a photoresist material, acetone or another resist stripper can be used to remove the dielectric nanoribbon without damaging the underlying graphene. In another embodiment, and when a very thin layer of $Al_2O_3$ (less than 100 nm) is employed as the dielectric material layer, a commercial aluminum etchant, or even a standard photoresist developer can be used to remove the $Al_2O_3$ layer without damaging the underlying graphene.

It is noted that in the structure shown in FIG. 8, the ordered array of parallel graphene nanoribbons 26 have sidewalls which are not in contact with another solid material layer. Instead, a graphene nanoribbon is separated from a neighboring graphene nanoribbon by air, another gas or vacuum.

Figure 9:
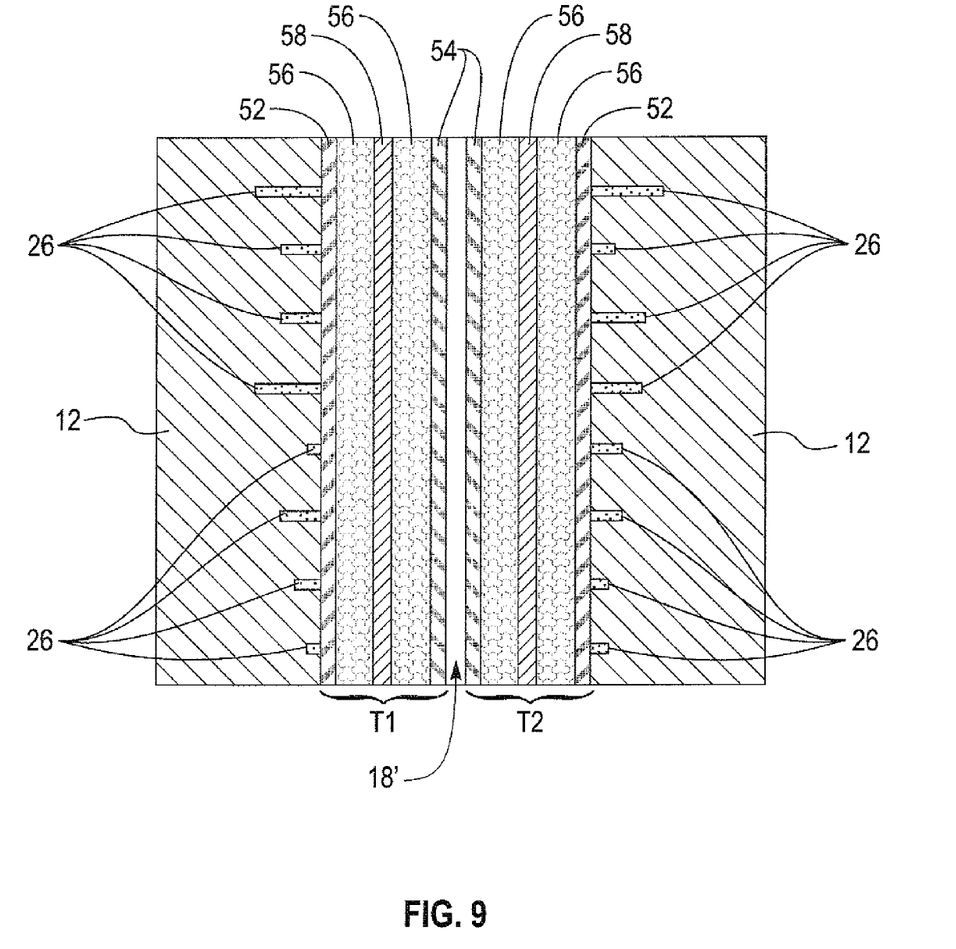
FIG. 9 is a pictorial representation (through a top down view) illustrating the structure of FIG. 8 after forming a field effect transistor (FET) in on the ordered array of parallel graphene nanoribbons.

Referring now to FIG. 9, there is illustrated the structure of FIG. 8 after forming at least one field effect transistor (FET) on the ordered array of parallel graphene nanoribbons 26; in FIG. 9, T1 represents a first FET and T2 represents a second FET. Specifically, FIG. 9 shows a semiconductor device 50 of the present application that is formed by first providing the structure shown in FIG. 8.

Although the present application illustrates forming an FET on the ordered array of parallel graphene nanoribbons, the present application is not limited to just those types of semiconductor devices. Instead, other semiconductor devices including, but not limited to, diodes, and BiCMOS, can be formed on the ordered array of parallel graphene nanoribbons.

The semiconductor device 50 further includes source regions 52 and drain regions 54. In the present description, the drain regions 54 are located across the ordered array of parallel graphene nanoribbons 26, near the gap 18' separating them, while the source regions 52 are located at the other sides of the ordered array of parallel graphene nanoribbons 26. The source regions 52 and drain regions 54 are conductive contacts that can be formed utilizing a conventional lift off process. Alternatively, the source regions 52 and the drain regions 54 can be formed by deposition, lithography and etching.

The source regions 52 and the drain regions 54 include a conductive material such as, but not limited to, polycrystalline silicon, polycrystalline silicon germanium, an elemental metal (e.g., tungsten, titanium, tantalum, aluminum, nickel, ruthenium, palladium and platinum), an alloy including at least two of the aforementioned elemental metals, a metal nitride (e.g., tungsten nitride, aluminum nitride, and titanium nitride), a metal silicide and multilayered combinations thereof. The metal silicides or nitrides may include a single metal or more than one metal can be present.

Next, gate dielectric layer 56 is formed between the source regions 52 and the drain regions 54. The gate dielectric layer 56 employed can include any insulating material such as for example, an organic polymer, an oxide, a nitride, an oxynitride or a multilayered stack thereof. In one embodiment, the gate dielectric layer 56 can include a semiconductor oxide, a semiconductor nitride or a semiconductor oxynitride.

In another embodiment, the gate dielectric layer 56 can include a dielectric metal oxide or mixed metal oxide having a dielectric constant that is greater than the dielectric constant of silicon oxide, i.e., 3.9. Typically, the dielectric material that can be employed as the gate dielectric layer 56 has a dielectric constant greater than 4.0, with a dielectric constant of greater than 8.0 being more typical. Such dielectric materials are referred to herein as high k dielectrics. Exemplary high k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Multilayered stacks of these high k materials can also be employed as the gate dielectric layer 56. Each value of x is independently from 0.5 to 3 and each value of y is independently from 0 to 2.

The thickness of the gate dielectric layer 56 that can be employed may vary depending on the technique used to form the same. Typically, the gate dielectric layer 56 that can be employed has a thickness from 1 nm to 20 nm, with a thickness from 2 nm to 10 nm being more typical.

The gate dielectric layer 56 can be formed by methods well known in the art. In one embodiment, the gate dielectric layer 56 can be formed by a deposition process such as, for example, chemical vapor deposition (CVD), plasma enhanced chemical vapor deposition (PECVD), physical vapor deposition (PVD), molecular beam deposition (MBD), pulsed laser deposition (PLD), liquid source misted chemical deposition (LSMCD), and atomic layer deposition (ALD). If the gate dielectric layer 56 is a stack of several layers, some of the layers can be deposited by chemical deposition or spin-on technique.

After forming the gate dielectric layer 56, a gate conductor 58 can be formed. The gate conductor 58 includes any conductive material including, but not limited to, polycrystalline silicon, polycrystalline silicon germanium, an elemental metal (e.g., tungsten, titanium, tantalum, aluminum, nickel, ruthenium, palladium and platinum), an alloy of at least two metals, a metal nitride (e.g., tungsten nitride, aluminum nitride, and titanium nitride), a metal silicide (e.g., tungsten silicide, nickel silicide, and titanium silicide) and multilayered combinations thereof. In one embodiment, the conductive material that can be employed as gate conductor 58 can be comprised of an nFET metal gate. In another embodiment, the conductive material that can be employed as gate conductor 58 can be comprised of a pFET metal gate. In a further embodiment, the conductive material that can be employed as gate conductor 58 can be comprised of polycrystalline silicon. The polysilicon conductive material can be used alone, or in conjunction with another conductive material such as, for example, a metal conductive material and/or a metal silicide material.

The conductive material that is employed as gate conductor 58 can be formed utilizing a conventional deposition process including, for example, chemical vapor deposition (CVD), plasma enhanced chemical vapor deposition (PECVD), physical vapor deposition (PVD), sputtering, atomic layer deposition (ALD) and other like deposition processes. When Si-containing materials are used as the conductive material, the Si-containing materials can be doped within an appropriate impurity by utilizing either an in-situ doping deposition process or by utilizing deposition, followed by a step such as ion implantation or gas phase doping in which the appropriate impurity is introduced into the Si-containing material. When a metal silicide is formed, a conventional silicidation process is employed. The as-deposited conductive material typically has a thickness from 1 nm to 100 nm, with a thickness from 3 nm to 30 nm being even more typical. Following deposition of the conductive material, the conductive material is patterned by lithography into the gate conductor 58.

In some embodiments of the present application, block mask technology can be employed to provide different materials, i.e., gate dielectric and/or gate conductor, to T1 and T2.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor structure comprising:
   forming a graphene layer on an upper surface of a substrate;
   patterning the graphene layer into a patterned graphene layer having at least one gap that exposes at least a portion of the upper surface of the substrate;
   forming a deterministically assembled parallel set of nanowires across the at least one gap that is located in the patterned graphene layer; and
   etching exposed portions of the patterned graphene layer, not protected by the deterministically assembled parallel set of nanowires, using the deterministically assembled parallel set of nanowires as an etch mask to provide a semiconductor structure including an ordered array of parallel graphene nanoribbons located on the upper surface of the substrate.

2. The method of claim 1 wherein said forming the graphene layer comprises providing the graphene layer to a handle substrate, and transferring the graphene layer to the substrate using a layer transfer process.

3. The method of claim 2 wherein said providing the graphene layer to the handle substrate includes epitaxial growth; mechanical exfoliation of graphite; hydrazine reduction in which a graphene oxide paper is placed in a solution of pure hydrazine which reduces the graphene oxide paper into single-layered graphene; thermal reduction of graphene oxide; or sodium reduction of ethanol to form an ethoxide product, pyrolyzing the ethoxide product and washing to remove sodium salts.

4. The method of claim 1 wherein said forming the patterned graphene layer comprises applying a photoresist to an upper surface of the graphene layer, exposing the photoresist to a desired pattern of radiation, developing the exposed photoresist, and transferring the pattern into the graphene layer utilizing an etching step.

5. The method of claim 1 further comprising forming a dielectric material layer on said patterned graphene layer and within said at least one gap prior to forming the deterministically assembled parallel set of nanowires.

6. The method of claim 1 wherein said forming the deterministically assembled parallel set of nanowires comprises an electric field assisted assembly method.

7. The method of claim 6 wherein said electric field assisted assembly method includes providing a suspension containing nanowires suspended therein; placing the substrate including the patterned graphene layer having said gap in said suspension, and applying an AC voltage to a neighboring pair of patterned graphene layers that are separated by said gap.

8. The method of claim 7 wherein said nanowires are metallic or semiconducting nanowires and the liquid of said suspension is an alcohol.

9. The method of claim 8 wherein said AC voltage is from 5 $V_{rms}$ to 70 $V_{rms}$.

10. The method of claim 1 further comprising forming at least one semiconductor device on said ordered array of parallel graphene nanoribbons.

* * * * *